United States Patent
Jang et al.

(10) Patent No.: US 11,088,561 B2
(45) Date of Patent: Aug. 10, 2021

(54) BATTERY MANAGEMENT SYSTEM USING TEMPERATURE INFORMATION INCLUDING A VARIABLY-SET REFERENCE TEMPERATURE

(71) Applicant: YKMC, Inc., Asan-si (KR)

(72) Inventors: Kwan Seop Jang, Pyeongtaek-si (KR); Gi Bum Jang, Pyeongtaek-si (KR)

(73) Assignee: YKMC, INC., Asan-si (KR)

( * ) Notice: Subject to any disclaimer, the term of this patent is extended or adjusted under 35 U.S.C. 154(b) by 265 days.

(21) Appl. No.: 16/395,581

(22) Filed: Apr. 26, 2019

(65) Prior Publication Data
US 2020/0343755 A1  Oct. 29, 2020

(51) Int. Cl.
| | | |
|---|---|---|
| *H02J 7/04* | (2006.01) | |
| *H02J 7/16* | (2006.01) | |
| *H02J 7/00* | (2006.01) | |
| *H01M 10/637* | (2014.01) | |
| *H01M 10/48* | (2006.01) | |
| *G01R 31/382* | (2019.01) | |
| *H01M 50/581* | (2021.01) | |

(52) U.S. Cl.
CPC .......... *H02J 7/0091* (2013.01); *G01R 31/382* (2019.01); *H01M 10/486* (2013.01); *H01M 10/637* (2015.04); *H01M 50/581* (2021.01); *H02J 7/0013* (2013.01)

(58) Field of Classification Search
CPC .................................................. H02J 7/0091
USPC ....................................................... 320/150
See application file for complete search history.

(56) References Cited

U.S. PATENT DOCUMENTS

| | | | | |
|---|---|---|---|---|
| 2011/0298417 A1* | 12/2011 | Stewart | ............... | H01M 10/482 320/107 |
| 2013/0026993 A1* | 1/2013 | Hintz | .................... | H02J 7/0016 320/119 |
| 2013/0314049 A1* | 11/2013 | van Lammeren | ........ | G01K 7/26 320/134 |
| 2014/0152261 A1* | 6/2014 | Yamauchi | ............ | G01R 31/396 320/118 |
| 2014/0306666 A1* | 10/2014 | Choi | ..................... | H02J 7/0016 320/134 |
| 2019/0280488 A1* | 9/2019 | Tang | ..................... | H01M 10/48 |

FOREIGN PATENT DOCUMENTS

KR  10-1465693 B1  12/2014

* cited by examiner

*Primary Examiner* — Yalkew Fantu
(74) *Attorney, Agent, or Firm* — Rabin & Berdo, P.C.

(57) ABSTRACT

The PWM signal corresponding to the at least one switch is output by reducing the output frequency of the PWM signal to be lower than that of the pervious PWM signal output immediately before the output of the PWM signal so as to prevent overheating during the on/off operation of the at least one switch corresponding to the at least one battery cell so that the at least one switch may perform the cell balancing function without being overheated and thus a voltage and current of a noise component during on/off switching of the at least one switch (e.g., an FET) may be reduced to prevent overheating of the at least one switch (e.g., an FET) and other circuit components (e.g., a capacitor, etc.) near the switch due to the voltage and current of the noise component, thereby preventing a malfunction of the battery management system.

1 Claim, 4 Drawing Sheets

[FIG 1]
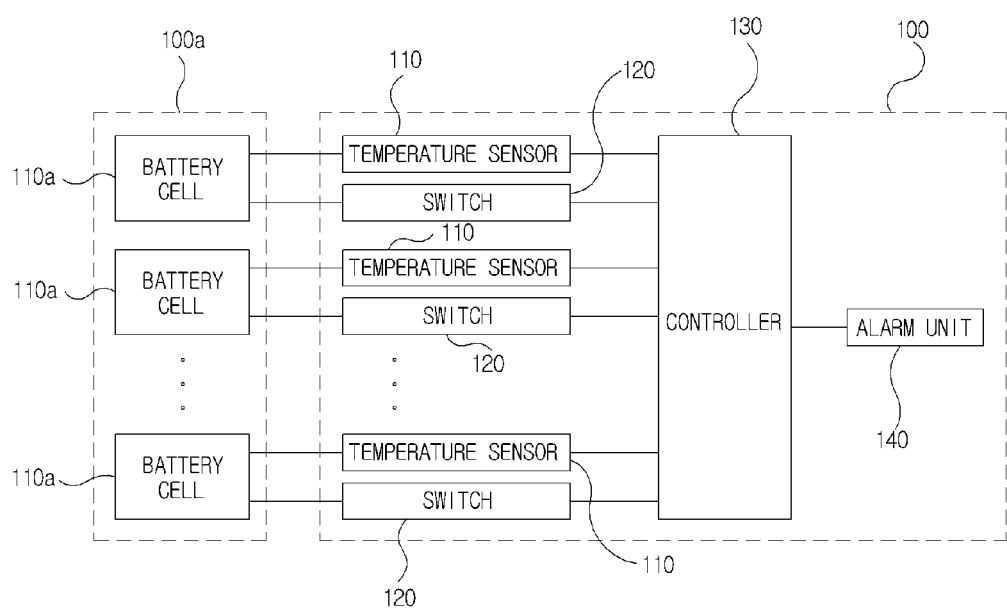

[FIG 2]
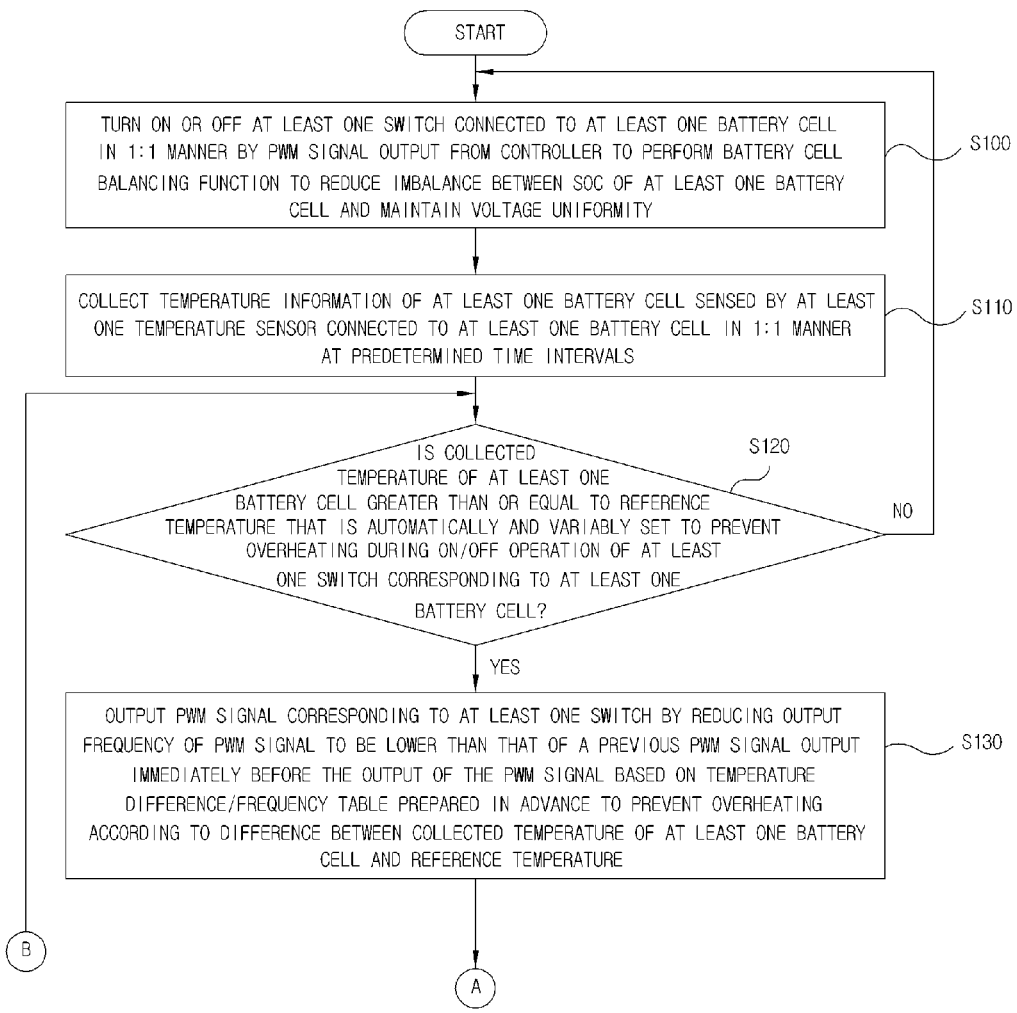

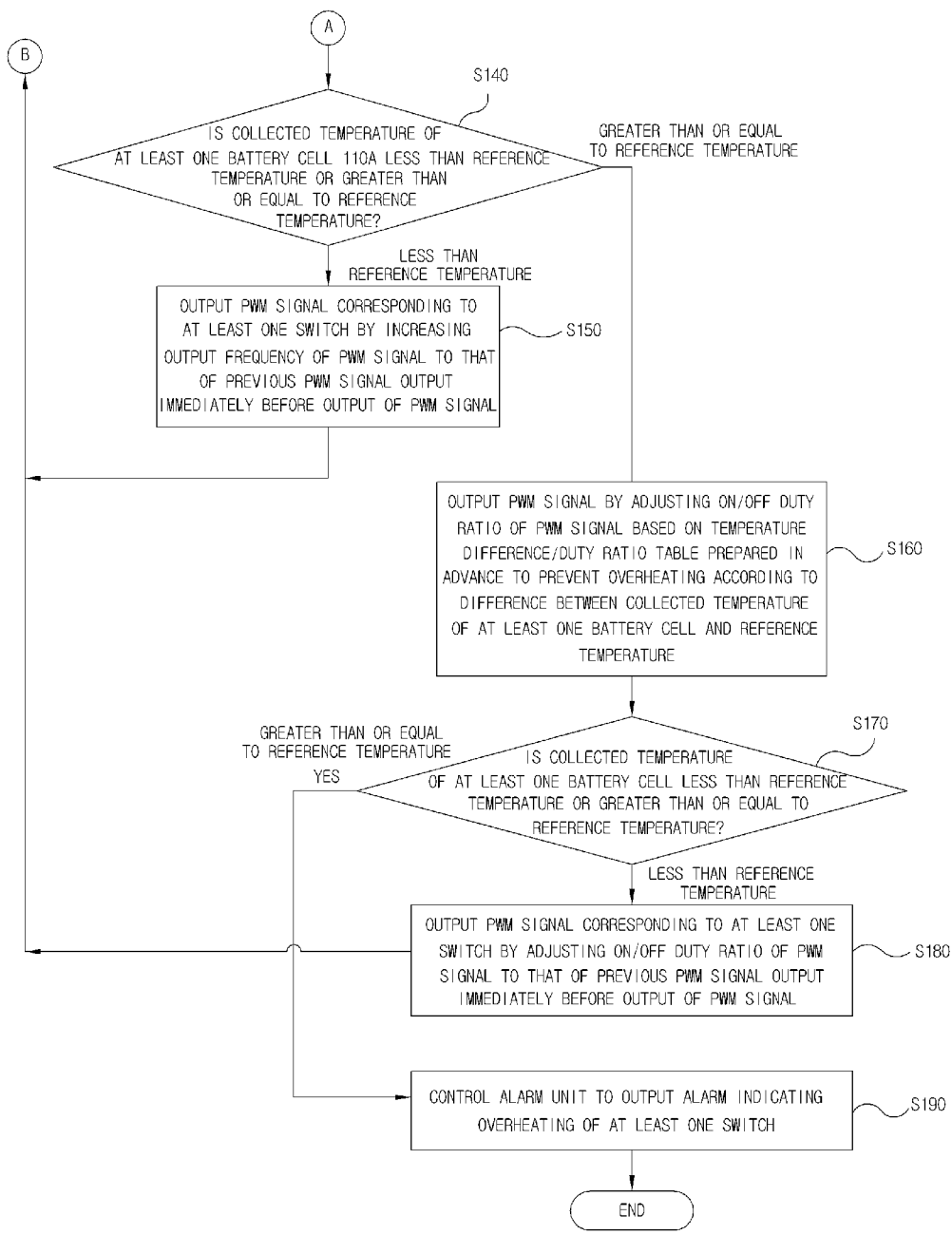
[FIG 3]

[FIG 4]

| REFERENCE TEMPERATURE(°C) | TEMPERATURE OF BATTERY CELL (°C) | TEMPERATURE DIFFERENCE(°C) | OUTPUT FREQUENCY(KHz) | ON/OFF DUTY RATIO(%) |
|---|---|---|---|---|
| #1 | #1 | #1 | #1 | #1 |
|  | #2 | #2 | #2 | #2 |
|  | ⋮ | ⋮ | ⋮ | ⋮ |
|  | #n | #n | #n | #n |
| #2 | #1 | #1 | #1 | #1 |
|  | #2 | #2 | #2 | #2 |
|  | ⋮ | ⋮ | ⋮ | ⋮ |
|  | #n | #n | #n | #n |
| ⋮ | ⋮ | ⋮ | ⋮ | ⋮ |
| #n | #1 | #1 | #1 | #1 |
|  | #2 | #2 | #2 | #2 |
|  | ⋮ | ⋮ | ⋮ | ⋮ |
|  | #n | #n | #n | #n |

BATTERY MANAGEMENT SYSTEM USING TEMPERATURE INFORMATION INCLUDING A VARIABLY-SET REFERENCE TEMPERATURE

BACKGROUND

1. Field of the Invention

The present invention relates to a battery management system, and more particularly, to a battery management system using temperature information, which is capable of performing a battery cell balancing function by sensing a change of temperature of each of a plurality of battery cells of a battery pack to reduce imbalance between states of charge (SoC) of the battery cells and maintain voltage uniformity.

2. Discussion of Related Art

Vehicles such as electric golf carts or electric cars use, as a high-voltage battery, a battery pack in which a plurality of battery cells to be charged or discharged are connected in series and/or in parallel.

In the battery pack, imbalance between states of charge (SOC) of the battery cells that are being charged or discharged inevitably occurs due to the difference between the battery cells in terms of manufacturing processes and capacities, self-discharge of the battery cells, operating conditions of the battery cells, deterioration of the battery cells over time, etc. Thus, vehicles such as electric golf carts or electric cars are equipped with a battery management system having a battery cell balancing function to reduce imbalance between SoC of battery cells that are being charged or discharged and maintain voltage uniformity.

For example, patent document 1 discloses a battery management system capable of performing battery cell balancing by a controller by identifying a battery cell to be balanced on the basis of a result of measuring voltage of each of at least one battery cell by a voltage measurer and outputting a pulse width modulation (PWM) signal to a switch, e.g., a field-effect transistor (FET), of a switching unit related to an output of the identified battery cell.

In the battery management system of the related art disclosed in patent document 1, in order to perform battery cell balancing, the controller outputs a PWM signal having a different duty cycle, i.e., a different on/off duty ratio, and the same fixed output frequency for each of the battery cells.

As described above, when the controller of the battery management system of the related art outputs the PWM signal having a different duty cycle, i.e., a different on/off duty ratio, and the same fixed output frequency for each of the battery cells to control on/off switching of the switch (e.g., the FET) of the switching unit related to the output of the battery cell, a voltage and current of a noise component may occur during the on/off switching of the switch (e.g., the FET) and thus the switch (e.g., the FET) and other circuit components (e.g., a capacitor, etc.) may be overheated due to the voltage and current of the noise component, thereby causing a malfunction of the battery management system.

PRIOR ART LITERATURE (Patent document 1) KR10-1465693 B1

SUMMARY OF THE INVENTION

To address the above-described problem of the related art, the present invention is directed to providing a battery management system using temperature information, in which, when temperature of at least one battery cell of a battery pack to be charged or discharged, which is sensed by at least one temperature sensor connected to the at least one battery cell in a 1:1 manner, is greater than or equal to a reference temperature that is automatically and variably set to prevent overheating during an on/off operation of at least one switch corresponding to the at least one battery cell, a pulse width modulation (PWM) signal corresponding to the at least one switch is output by reducing an output frequency of the PWM signal to be lower than that of a previous PWM signal output immediately before the output of the PWM signal based on a temperature difference/frequency table prepared in advance to prevent overheating according to the difference between a collected temperature of the at least one battery cell and the reference temperature, thereby allowing the switch to perform a cell balancing function without being overheated.

The present invention is also directed to providing a battery management system using temperature information in which a battery cell average temperature calculated by collecting temperature information of a battery cell sensed by a temperature sensor at predetermined time intervals is variably set as a reference temperature so that a corresponding switch may perform a cell balancing function without being overheated.

According to an aspect of the present invention, a battery management system using temperature information includes at least one temperature sensor connected in a 1:1 manner to at least one battery cell of a battery pack to be charged or discharged and configured to sense temperature of the at least one battery cell; at least one switch connected to the at least one battery cell in the 1:1 manner and configured to be turned on or off by a PWM signal output from a controller to perform a battery cell balancing function to reduce imbalance between states of charge of the at least one battery cell and maintain voltage uniformity; and the controller configured to collect temperature information of the at least one battery cell sensed by the at least one temperature sensor at predetermined time intervals and output a PWM signal corresponding to the at least one switch by reducing an output frequency of the PWM signal to be lower than that of a previous PWM signal output immediately before the output of the PWM signal so as to allow the at least one switch to perform the cell balancing function without being overheated based on a temperature difference/frequency table prepared in advance to prevent overheating according to the difference between a collected temperature of the at least one battery cell and the reference temperature when the collected temperature of the at least one battery cell is greater than or equal to the reference temperature automatically and variably set to prevent overheating during an on or off operation of the at least one switch corresponding to the at least one battery cell.

In the battery management system using temperature information according to the present invention, the controller may set variably, as the reference temperature, a battery cell average temperature calculated by collecting temperature information of the at least one battery cell sensed by the at least one temperature sensor at predetermined time intervals.

In the battery management system using temperature information according to the present invention, the controller may output the PWM signal corresponding to the at least one switch by increasing the output frequency of the PWM signal to that of a previous PWM signal output immediately before the output of the PWM signal when temperature of the at least one battery cell collected after outputting the PWM signal by reducing the output frequency of the PWM signal is less than the reference temperature.

In the battery management system using temperature information according to the present invention, the controller may output the PWM signal by adjusting an on/off duty ratio of the PWM signal based on a temperature difference/duty ratio table prepared in advance to prevent overheating according to the difference between a collected temperature of the at least one battery cell and the reference temperature when the temperature of the at least one battery cell collected after outputting the PWM signal by reducing the output frequency of the PWM signal is greater than or equal to the reference temperature that is set in advance to prevent overheating during the on or off operation of the at least one switch corresponding to the at least one battery cell.

In the battery management system using temperature information according to the present invention, when temperature of the at least one battery cell collected after outputting the PWM signal by adjusting the on/off duty ratio of the PWM signal is less than the reference temperature, the controller may output the PWM signal corresponding to the at least one switch by adjusting the on/off duty ratio of the PWM signal to that of the previous PWM signal output immediately before the output of the PWM signal.

In the battery management system using temperature information according to the present invention, the controller may control an alarm unit to output an alarm indicating overheating of the at least one switch when the temperature of the at least one battery cell collected after outputting the PWM signal by adjusting the on/off duty ratio of the PWM signal is greater than or equal to the reference temperature.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a block diagram illustrating a structure of a battery management system using temperature information according to the present invention;

FIGS. 2 and 3 are flowcharts illustrating an operation of a battery management system using temperature information according to the present invention; and FIG. 4 illustrates a temperature difference/frequency table and a temperature difference/duty ratio table according to an embodiment of the present invention.

DETAILED DESCRIPTION OF EXEMPLARY EMBODIMENTS

Hereinafter, exemplary embodiments of the present invention will be described in detail with reference to the accompanying drawings below.

Referring to FIG. 1, a battery management system 100 using temperature information includes at least one temperature sensor 110, at least one switch 120, a controller 130, and an alarm unit 140.

The at least one temperature sensor 110 is connected in a 1:1 manner to at least one battery cell 110a of a battery pack 100a to be charged or discharged and senses temperature of the at least one battery cell 110a.

The at least one switch 120 is connected to the at least one battery cell 110a in a 1:1 manner and is turned on or off by a pulse width modulation (PWM) signal output from the controller 130 to perform a battery cell balancing function to reduce imbalance between states of charge (SoC) of the at least one battery cell 110a and maintain voltage uniformity.

The at least one switch 120 may be any type of a switching device that is turned on or off by the PWN signal and may be a voltage/current-controlled switch device such as a field-effect transistor (FET).

The controller 130 collects temperature information of the at least one battery cell 110a sensed by the at least one temperature sensor 110 at predetermined time intervals.

When the collected temperature of the at least one battery cell 110a is greater than or equal to a reference temperature that is automatically and variably set to prevent overheating during an on/off operation of the at least one switch 120 corresponding to the at least one battery cell 110a, the controller 130 outputs a PWM signal corresponding to the at least one switch 120 by reducing an output frequency of the PWM signal to be lower than that of a previous PWM signal output immediately before the output of the PWM signal based on a temperature difference/frequency table prepared in advance to prevent overheating according to the difference between the collected temperature of the at least one battery cell 110a and the reference temperature, thereby allowing the at least one switch 120 to perform the cell balancing function without being overheated.

The controller 130 variably sets, as the reference temperature, a battery cell average temperature calculated by collecting temperature information of the at least one battery cell 110a sensed by the at least one temperature sensor 110 at predetermined time intervals.

After the PWM signal is output by reducing the output frequency thereof, when a collected temperature of the at least one battery cell 110a is less than the reference temperature, the controller 130 outputs the PWM signal by increasing the output frequency of the PWM signal corresponding to the at least one switch 120 to that of the previous PWM signal output immediately before the output of the PWM signal.

After the PWM signal is output by reducing the output frequency thereof, when the collected temperature of the at least one battery cell 110a is greater than or equal to the reference temperature that is set in advance to prevent overheating during an on/off operation of the at least one switch 120 corresponding to the at least one battery cell 110a, the controller 130 outputs the PWM signal by adjusting an on/off duty ratio of the PWM signal based on a temperature difference/duty ratio table prepared in advance to prevent overheating according to the difference between the collected temperature of the at least one battery cell 110a and the reference temperature.

After the PWM signal is output by adjusting the on/off duty ratio thereof, when the collected temperature of the battery cell 110a is less than the reference temperature, the controller 130 outputs the PWM signal corresponding to the at least one switch 120 by adjusting the on/off duty ratio of the PWM signal to that of the previous PWM signal output immediately before the output of the PWM signal and increasing the output frequency of the PWM signal to that of the previous PWM signal.

After the PWM signal is output by adjusting the on/off duty ratio thereof, when the collected temperature of the at least one battery cell 110a is greater than or equal to the reference temperature, the controller 130 controls the alarm unit 140 to output an alarm indicating overheating of the at least one switch 120.

The alarm unit 140 outputs the alarm indicating overheating, for example, in the form of a voice alarm or a voice message or by turning on or flickering a warning light.

An operation of the above-described battery management system 100 using temperature information according to the present invention will be described below.

FIGS. 2 and 3 are flowcharts illustrating an operation of the battery management system 100 using temperature information according to the present invention.

Referring to FIGS. 2 and 3, in the battery management system 100 using temperature information 100 according to the present invention, the at least one switch 120 connected to the at least one battery cell 110*a* in the 1:1 manner is turned on or off by a PWM signal output from the controller 130 to perform the battery cell balancing function to reduce imbalance between the SoC of the at least one battery cell 110*a* and maintain voltage uniformity (S100).

While the at least one switch 120 connected to the at least one battery cell 110*a* in the 1:1 manner is turned on or off and performs the battery cell balancing function, the controller 130 collects temperature information of the at least one battery cell 110*a* sensed by the at least one temperature sensor 110 connected to the at least one battery cell 110*a* in the 1:1 manner at predetermined time intervals (S110).

In an embodiment of the present invention, the predetermined time intervals at which the temperature information of the battery cell 110*a* is collected may be set to several seconds or several minutes according to the number of the at least one battery cell 110*a* of the battery pack 100*a* to be charged or discharged.

After the temperature information of the at least one battery cell 110*a* is collected at the predetermined time intervals, the controller 130 identifies whether the collected temperature of the at least one battery cell 110*a* is greater than or equal to a reference temperature that is automatically and variably set to prevent overheating during an on/off operation of the at least one switch 120 corresponding to the at least one battery cell 110*a* (S120).

In this case, the controller 130 variably sets, as the reference temperature, a battery cell average temperature calculated by collecting the temperature information of each of the at least one battery cell 110*a* sensed by the at least one temperature sensor 110 connected to the at least one battery cell 110*a* in the 1:1 manner at the predetermined time intervals so that the at least one switch 120 may perform the cell balancing function without being overheated.

As described above, when the controller 130 variably sets the calculated battery cell average temperature as the reference temperature to allow the at least one switch 120 to perform the cell balancing function without being overheated, a temperature of the battery pack 100*a* that includes the at least one battery cell 110*a* and that is to be charged or discharged may be maintained at the battery cell average temperature, thereby preventing overheating of the battery pack 100*a*.

When it is determined in S120 that the collected temperature of the at least one battery cell 110*a* is greater than or equal to the reference temperature that is automatically and variably set to prevent overheating during the on/off operation of the at least one switch 120 corresponding to the at least one battery cell 110*a*, the controller 130 outputs a PWM signal corresponding to the at least one switch 120 by reducing an output frequency of the PWM signal to be lower than that of a previous PWM signal output immediately before the output of the PWM signal based on a temperature difference/frequency table prepared in advance to prevent overheating according to the difference between the collected temperature of the at least one battery cell 110*a* and the reference temperature (S130).

In this case, the on/off duty ratio of the previous PWM signal corresponding to the at least one switch 120 and output immediately before the output of the PWM signal and the on/off duty ratio of the PWM signal output by reducing the output frequency thereof may be maintained to be constant without being changed.

FIG. 4 illustrates a temperature difference/frequency table showing an output frequency (KHz) (e.g., #1, #2, . . . , or #n) set in advance to prevent overheating versus the difference (° C.) (e.g., #1, #2, . . . , or #n) between a collected temperature (° C.) (e.g., #1, #2, . . . , or #n) of a certain battery cell 110*a* and a reference temperature (° C.) (e.g., #1, #2, . . . , or #n) that is set variably as a battery cell average temperature as described above.

For example, as illustrated in FIG. 4, when the collected temperature of the battery cell 110*a* is #1° C., when the reference temperature that is variably set as a battery cell average temperature is #1° C., and when the difference between these temperatures is #1° C., the controller 130 outputs a PWM signal corresponding to the at least one switch 120 corresponding to the battery cell 110*a* by reducing an output frequency of the PWM signal to be lower than that of a previous PWM signal output immediately before the output of the PWM signal, e.g., to #1 kHz.

As described above, in S130, the controller 130 outputs the PWM signal corresponding to the at least one switch 120 by reducing the output frequency of the PWM signal to be lower than that of the previous PWM signal output immediately before the output of the PWM signal based on the temperature difference/frequency table so that the at least one switch 120 may perform the cell balancing function without being overheated to reduce a voltage and current of a noise component during on/off switching of the at least one switch 120 (e.g., an FET) and thus the at least one switch 120 (e.g., an FET) and other circuit components (e.g., a capacitor, etc.) near the at least one switch 120 may be prevented from being overheated due to the voltage and current of the noise component, thereby preventing a malfunction of the battery management system 100.

After in S130, when the controller 130 outputs the PWM signal by reducing the output frequency of the PWM signal as described above, the controller 130 identifies whether a collected temperature of the at least one battery cell 110*a* is less than the reference temperature or is greater than or equal to the reference temperature (S140).

When it is determined in S140 that the collected temperature of the at least one battery cell 110*a* is less than the reference temperature, the controller 130 outputs the PWM signal corresponding to the at least one switch 120 by increasing the output frequency of the PWM signal to that of the previous PWM signal output immediately before the output of the PWM signal (S150) and returns to S120 described above.

Unlike that described above, when it is determined in S140 that the collected temperature of the at least one battery cell 110*a* is greater than or equal to the reference temperature, the controller 130 outputs the PWM signal by adjusting an on/off duty ratio of the PWM signal based on the temperature difference/duty ratio table prepared in advance to prevent overheating according to the difference between the collected temperature of the at least one battery cell 110*a* and the reference temperature (S160).

In this case, the output frequency of the previous PWM signal corresponding to the at least one switch 120 and output immediately before the output of the PWM signal and the output frequency of the PWM signal output by adjusting the on/off duty ratio thereof may be maintained to be constant without being changed.

FIG. 4 illustrates a temperature difference/duty ratio table showing an on/off duty ratio (%) ((e.g., #1, #2, . . . , or #n) that is set in advance to prevent overheating versus the difference (° C.) (e.g., #1, #2, . . . , or #n) between a collected temperature (° C.) (e.g., #1, #2, . . . , or #n) of a certain battery cell 110*a* and a reference temperature (° C.) (e.g., #1, #2, . . . , or #n) that is set variably as a battery cell average temperature as described above.

For example, as illustrated in FIG. 4, when the collected temperature of a battery cell 110*a* is #1° C., when the reference temperature that is variably set as a battery cell average temperature is #1° C., and when the difference between these temperatures is #1° C., the controller 130 outputs a PWM signal of the switch 120 corresponding to the corresponding battery cell 110*a* by adjusting an on/off duty ratio of the PWM signal to #1%. As described above, in S160, the controller 130 outputs the PWM signal corresponding to the at least one switch 120 by adjusting the on/off duty ratio of the PWM signal based on the temperature difference/duty ratio table so that the at least one switch 120 may perform the cell balancing function without being overheated to reduce a voltage and current of a noise component during an off/off switching of the at least one switch 120 (e.g., an FET) and thus the at least one switch 120 (e.g., an FET) and other circuit components (e.g., a capacitor, etc.) near the at least one switch 120 may be prevented from being overheated due to the voltage and current of the noise component, thereby preventing a malfunction of the battery management system 100.

After in S160, when the controller 130 outputs the PWM signal by adjusting the on/off duty ratio of the PWM signal as described above, the controller 130 identifies whether a temperature of the at least one battery cell 110*a* collected thereafter is less than the reference temperature or is greater than or equal to the reference temperature (S170).

When it is determined in S170 that the collected temperature of the at least one battery cell 110*a* is less than the reference temperature, the controller 130 outputs the PWM signal corresponding to the at least one switch 120 by adjusting the on/off duty ratio of the PWM signal to that of the previous PWM signal output immediately before the output of the PWM signal (S180) and returns to S120 described above.

Unlike that described above, when it is determined in S170 that the collected temperature of the at least one battery cell 110*a* is greater than or equal to the reference temperature, the controller 130 controls the alarm unit 140 to output an alarm indicating overheating of the at least one switch 120 (S190).

In this case, the alarm unit 140 may output the alarm indicating overheating, for example, in the form of a voice alarm or a voice message or by turning on or flickering a warning light.

When the alarm unit 140 outputs the alarm indicating overheating as described above, a manager or a user of the battery management system 100 using temperature information according to the present invention may check the battery pack 100*a* and perform a maintenance work to replace a battery cell 110*a* determined to be defective due to overheating with a new one, if necessary.

As described above, according to the present invention, in a battery management system using temperature information, a PWM signal corresponding to a switch corresponding to a battery cell is output by reducing an output frequency of the PWM signal to be lower than that of a previous PWM signal output immediately before the output of the PWM signal based on a temperature difference/frequency table prepared in advance to prevent overheating during an on/off operation of the switch so that the switch may perform the cell balancing function without being overheated to reduce a voltage and current of a noise component during on/off switching of the switch (e.g. an FET) and thus the switch (e.g., an FET) and other circuit components (e.g., a capacitor, etc.) near the switch may be prevented from being overheated due to the voltage and current of the noise component, thereby preventing a malfunction of the battery management system.

According to the present invention, a battery cell average temperature calculated by collecting temperature information of each of at least one battery cell sensed by at least one temperature sensor corresponding to the at least one battery cell in a 1:1 manner at predetermined time intervals is variably set to a reference temperature to allow a corresponding switch to perform the cell balancing function without being overheated. Accordingly, a temperature of a battery pack that includes the at least one battery cell and that is to be charged or discharged may be maintained at the battery cell average temperature and thus the battery pack may be prevented from being overheated.

The battery management system using temperature information according to the present invention as described above is not limited to the above-described embodiments, and various changes may be made therein by those of ordinary skill in the art without departing from the scope of the present invention defined in the following claims.

What is claimed is:

1. A battery management system using temperature information, comprising:
at least one temperature sensor connected in a 1:1 manner to at least one battery cell of a battery pack to be charged or discharged and each configured to sense temperature of one of the at least one battery cell;
at least one switch connected to the at least one battery cell in the 1:1 manner and configured to be turned on or off by a pulse width modulation (PWM) signal output from a controller to perform a battery cell balancing function to reduce imbalance between states of charge of the at least one battery cell and maintain voltage uniformity; and
the controller configured to collect temperature information of the at least one battery cell sensed by the at least one temperature sensor at predetermined time intervals, output a PWM signal corresponding to each of the at least one switch by reducing an output frequency of the PWM signal to be lower than an output frequency of a previous PWM signal output immediately before the output of the PWM signal so as to allow the each of the at least one switch to perform the cell balancing function without being overheated based on a temperature difference/frequency table prepared in advance to prevent overheating according to a difference between a collected temperature of a corresponding one of the at least one battery cell and a reference temperature when the collected temperature of the corresponding one of the at least one battery cell is greater than or equal to the reference temperature, the reference temperature being automatically and variably set to prevent overheating during an on or off operation of an each of the at least one switch corresponding to the corresponding one of the at least one battery cell, and output the PWM signal corresponding to the each of the at least one switch, by increasing the output frequency of the PWM signal to that of a previous PWM signal output immediately before the output of the PWM signal when the temperature of the corresponding one of the at least one battery cell collected after outputting the PWM signal by reducing the output frequency of the PWM signal is less than the reference temperature, and output the PWM signal by adjusting an on/off duty ratio of the PWM signal based on a temperature difference/duty ratio table prepared in advance to prevent overheating according to the difference between the collected temperature of the corresponding one of the at least one battery cell and the reference temperature when the temperature of the corresponding one of the at least one battery cell collected after outputting the PWM signal by reducing the output frequency of the PWM signal is greater than or equal to the reference temperature that is set in advance to prevent overheating during the on or off operation of the each of the at least one switch corresponding to the corresponding one of the at least one battery cell;

wherein the controller sets variably, as the reference temperature, a battery cell average temperature calculated by collecting temperature information of the at least one battery cell sensed by the at least one temperature sensor at predetermined time intervals; and wherein, when temperature of the corresponding one the at least one battery cell collected after outputting the PWM signal by adjusting the on/off duty ratio of the PWM signal is less than the reference temperature, the controller outputs the PWM signal corresponding to the each of the at least one switch by adjusting the on/off duty ratio of the PWM signal to an on/off duty ratio of the previous PWM signal output immediately before the output of the PWM and controls an alarm unit to output an alarm indicating overheating of the each of the at least one switch when the temperature of the corresponding one of the at least one battery cell collected after outputting the PWM signal by adjusting the on/off duty ratio of the PWM signal is greater than or equal to the reference temperature.

\* \* \* \* \*